United States Patent
Berg et al.

(10) Patent No.: US 6,450,416 B1
(45) Date of Patent: Sep. 17, 2002

(54) DEVICE AND METHOD FOR JETTING DROPLETS

(75) Inventors: Johan Berg, Uppsala; William Holm, Stockholm; Johan Kronstedt, Sollentuna; Kenth Nilsson, Åkersberga, all of (SE)

(73) Assignee: Mydata Automation AB, Bromma (SE)

(*) Notice: Subject to any disclaimer, the term of this patent is extended or adjusted under 35 U.S.C. 154(b) by 0 days.

(21) Appl. No.: 09/719,237

(22) PCT Filed: Jun. 8, 1999

(86) PCT No.: PCT/SE99/00996

§ 371 (c)(1),
(2), (4) Date: Jan. 31, 2001

(87) PCT Pub. No.: WO99/64167

PCT Pub. Date: Dec. 16, 1999

(30) Foreign Application Priority Data

Jun. 11, 1998 (SE) .............................................. 9802079

(51) Int. Cl.[7] .............................................. B05B 17/04
(52) U.S. Cl. ...................... 239/4; 239/102.1; 239/102.2
(58) Field of Search .......................... 239/102.1, 102.2, 239/4

(56) References Cited

U.S. PATENT DOCUMENTS

| 3,711,020 | A | * | 1/1973 | Zelna ............................. 239/1 |
| 5,248,087 | A | * | 9/1993 | Dressler ..................... 239/102.2 |
| 5,564,606 | A | | 10/1996 | Engel |
| 5,656,339 | A | * | 8/1997 | Wesseling et al. ........ 239/102.1 |
| 5,894,980 | A | * | 4/1999 | Orme-Marmarelis et al. .... 118/300 |
| 5,931,355 | A | | 8/1999 | Jefferson |
| 5,984,147 | A | * | 11/1999 | Van Ngo ..................... 222/240 |
| 6,325,271 | B1 | * | 12/2001 | Farnworth ................... 222/591 |

FOREIGN PATENT DOCUMENTS

| GB | 074240 A2 | 10/1981 |
| WO | A1-9112106 | 8/1991 |
| WO | A1-9719327 | 5/1997 |

* cited by examiner

Primary Examiner—Robin O. Evans
(74) Attorney, Agent, or Firm—Birch, Stewart, Kolasch & Birch, LLP

(57) ABSTRACT

The present invention refers to a method and a device for jetting droplets of a viscous medium onto an electronic circuit board. According to the invention, the viscous medium is applied from a viscous medium supply container to an eject chamber through a tubular passage using a rotatable feed screw arranged within the tubular passage. The viscous medium is then jetted from the eject chamber through an eject nozzle by the rapid decreasing of the volume of the chamber.

26 Claims, 6 Drawing Sheets

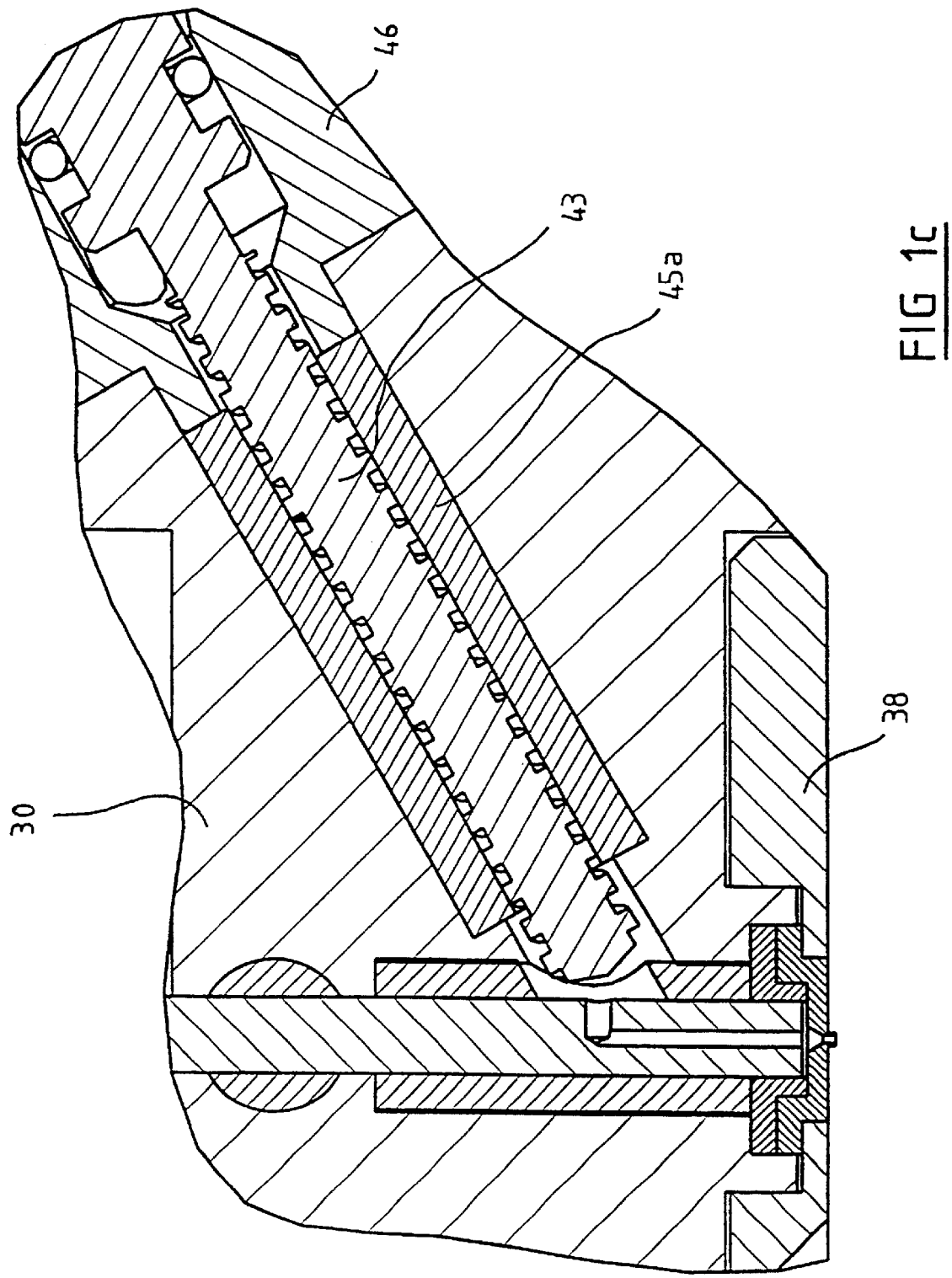

DEVICE AND METHOD FOR JETTING DROPLETS

This application is the national phase under 35 U. S. C. §371 of PCT International Application No. PCT/SE99/00996 which has an International filing date of Jun. 8, 1999, which designated the United States of America.

TECHNICAL FIELD OF INVENTION

The present invention refers to a device for jetting droplets of a viscous medium onto a substrate, preferably an electronic circuit board, said device comprising an eject chamber for containing a small volume of said medium prior to the jetting thereof, an eject nozzle communicating with the eject chamber, eject means for jetting said medium from the eject chamber through the eject nozzle, and supply means for feeding said medium into the eject chamber.

The invention also refers to a corresponding method for jetting droplets of a viscous medium onto a substrate, preferably an electronic circuit board.

BACKGROUND OF THE INVENTION

Devices of the above mentioned kind are previously known which are primarily intended to be used for jetting small droplets of a solder paste, an electrically conductive glue, a surface mounting glue, or the like, on electric circuit boards before placing components intended to be surface mounted thereon, but which may be used also for applying other viscous mediums on any suitable kind of substrate.

For example, WO 91/12106 describes a method for rapidly dispensing droplets of a material such as solder paste and glue onto an electronic circuit board, wherein said material is fed from a container through an inlet, using overpressure, to a pump chamber and is then jetted through a nozzle connected to said chamber by the rapid reduction of the volume of the chamber using a magnetostrictive element.

A disadvantage with this kind of technique for providing the material from the reservoir to the chamber is that the feeding of the material is difficult to control due to, inter alia, the large distance between the pressure source and the chamber and the compressibility of the material.

SUMMARY OF THE INVENTION

An object of the invention is to provide a solution which allows for a simple, reliable and more accurate control of the supply of a viscous medium to an eject chamber.

This and other objects are achieved by the invention as defined in the accompanying claims.

Hence, according to a first aspect of the invention, there is provided a device of the kind mentioned in the introduction, said device being characterised by said supply means comprising: means defining a tubular passage; an inlet for introducing said medium into said tubular passage and an outlet for passing said medium from said tubular passage towards said chamber; a rotatable feed screw provided in said tubular passage for, upon rotation thereof, forcing said medium through said tubular passage in the direction towards said chamber; and drive means for rotating said rotatable feed screw.

According to a second aspect of the invention, there is provided a method of the kind mentioned in the introduction, said method being characterised by the steps of: supplying said medium from a viscous medium supply container to an eject chamber using a rotatable feed screw; and jetting said medium from the eject chamber in the form of droplets.

It is to be noted that the eject means, as used in this application, refers to the means that interacts in the rapid reduction of the eject chamber for providing the jetting of droplets of said viscous medium. The jetting of droplets is achieved completely separate from the rotational movement of the feed screw, the rotational movement providing the feeding of said medium to the eject chamber.

For the purposes of this application, it is furthermore to be noted that the term "viscous medium" should be interpreted as solder paste, flux, adhesive, conductive adhesive, or any other kind of medium used for fastening components on a substrate, or resistive paste; and that the term "substrate" should be interpreted as a printed circuit board (PCB), a substrate for ball grid arrays (BGA), chip scale packages (CSP), quad flat packages (QFP), and flip-chips or the like. It is also to be noted that the term "jetting" should be interpreted as a non-contact dispensing process that utilises a fluid jet to form and shoot droplets of a viscous medium from a jet nozzle onto a substrate, as compared to a contact dispensing process, such as "fluid wetting", which is the act of the viscous medium leaving the dispense tip, contacting and clinging to the substrate and remaining on the substrate as the dispense tip pulls away.

Thus, the invention is based upon the idea of using a rotatable feed screw for feeding the viscous medium to the eject chamber. The use of such a rotatable feed screw makes it possible to control the feeding of viscous medium to the eject chamber in an advantageously accurate, rapid and simple manner. As is understood, rotational movement of the rotatable feed screw will immediately affect the behaviour of the viscous medium at the output end of the rotatable feed screw near the eject chamber, whereas control of a pressure device according to prior art will cause an effect at the eject chamber only after the passing of a certain time delay which is given by the time it takes for a pressure wave to travel through the medium from the pressure device to the chamber. The use of a rotatable feed screw even makes it possible to partly withdraw viscous medium from the eject chamber by reversing the direction of rotation of the feed screw. According to the invention, the volume in which the compressibility of the viscous medium may have a negative effect is decreased considerably, thus limiting the negative effects caused by said compressibility.

In this context, it is noted that the use of a rotatable screw is known per se, for example as disclosed in WO 97/19327 as an augering screw and in U.S. Pat. No. 5,564,606 as a feed screw, for accomplishing dispensing of solder paste onto an electronic circuit board using so called "fluid wetting", as described above, wherein the viscous medium makes contact with the electronic circuit board while the medium is still connected to the nozzle. Such "fluid wetting" is not designed for the jetting, as defined above, or even for the rapid dispensing, of solder paste onto an electronic circuit board.

According to a preferred embodiment of the invention, at least an inner portion of said means defining a tubular passage shows elastic, or resilient, properties. One difficulty in using a rotatable feed screw to transfer, e.g., a solder paste is that the spheres or particles of solder material dispersed in the solder paste may be negatively smeared out, or the like, by the action of the threads of the rotational feed screw against the surrounding tubular passage. It has surprisingly been found that such negative effects may be reduced or even eliminated if the walls surrounding the rotatable feed screw, and generally making sliding contact with the threads thereof, is made resilient. According to one embodiment, this is accomplished by the provision of an elastomeric tubular sleeve surrounding at least a portion of said rotatable feed screw. According to another alternative, an array of elastomeric o-rings surrounding at least a portion of said rotatable feed screw is provided to form said tubular passage. As is understood, this preferred embodiment and these alternatives are especially preferred when the invention is used for applying solder paste. Furthermore, providing a rotational feed screw with said features according to this particular preferred embodiment could advantageosly also be used in a dispensing device of a general kind for feeding a viscous medium to a dispensing location in the dispensing device for subsequent dispensing from the dispensing location onto a suitable substrate. Making said surrounding walls resilient also has the advantageous effect of allowing greater manufacturing tolerances.

Typically, said medium will be provided from a viscous medium supply container communicating with said inlet to the rotatable feed screw for providing a source for said medium. According to a preferred embodiment, a pressure is applied onto the medium supplied from said supply container, said pressure being sufficiently large to ensure an essentially void free condition within said tubular passage and being sufficiently small not to force said medium through said tubular passage in excess of the feed action provided by said rotatable feed screw.

As will be described below with reference to the accompanying drawings, according to one embodiment, said tubular passage and said rotatable feed screw are arranged coaxially with respect to the direction of movement of said eject means, and, according to another embodiment, said tubular passage and said rotatable feed screw are arranged to supply said medium at an angle with respect to the direction of movement of said eject means. Advantages of the former alternative is that a more compact, integrated and less bulky arrangement is typically achieved and that it makes it easier to provide sufficient sealing, whereas an advantage of the latter alternative is that a more separated system is typically achieved, often making it easier to dismantle and clean. Also, in the former alternative, an end portion of the rotatable feed screw may preferably define a plunger forming a wall of said eject chamber.

According to another preferred embodiment of the invention, said medium is fed from the output end of said tubular passage to said eject chamber through a channel provided within a plunger defining a wall of said eject chamber. Preferably, at least a portion of said channel at the end of the plunger facing said eject chamber is coaxially arranged with respect to said plunger. When rapidly decreasing the volume of the eject chamber, the medium contained therein is both ejected through the eject nozzle and forced backwards towards the rotational feed screw. These opposite actions will depend upon, inter alia, the flow resistance in the backwards direction. If the medium is directed to said eject chamber laterally with respect to said plunger, this flow resistance will vary as the distance between the plunger and the nozzle is changed, thus placing high demands upon the design tolerances of this distance. According to said embodiment, wherein a channel leading to the eject chamber is provided within the plunger, the flow resistance in the backwards direction will be independent of the distance between the plunger and the nozzle, thus making it easier to control the eject operation.

It is understood that the rotatable feed screw of the invention may be formed in many different ways. However, preferable results have been achieved with the use of a double-threaded screw.

Furthermore, the feed screw according to a first embodiment of the invention constitutes a constructional element which is separate from said eject means. According to a second embodiment of the invention, the feed screw is also used for the ejection of the viscous medium, i.e. comprised in the eject means, for instance as a movable eject element, or as a rigid element providing a counter support for said ejection. However, it must to be noted that even though the feed screw is involved in the ejection of the viscous medium, the rotational movement of the feed screw is not.

As will be described below with reference to the drawings, the medium is preferably jetted from said eject nozzle by the rapid actuation of a magnetostrictive, piezoelectric, electrostrictive, electromagnetic, or shape memory alloy actuator.

The above mentioned and other aspects, advantages, and features of the invention will be more fully understood from the following description of exemplifying embodiments thereof.

BRIEF DESCRIPTION OF THE DRAWINGS

Exemplifying embodiments of the invention will be described below with reference to the accompanying drawings, in which:

FIG. 1b shows an enlarged view of a central portion of the sectional view shown in FIG. 1a;

FIG. 1c shows an enlarged view of an alternative embodiment of the central portion of the sectional view shown in FIG. 1a;

FIG. 2b shows an enlarged view of a central portion of the sectional view shown in FIG. 2a; and FIG. 2c shows an enlarged view of an alternative embodiment of the central portion of the sectional view shown in FIG. 2a.

DETAILED DESCRIPTION OF PREFERRED EMBODIMENTS

Figure 1A:
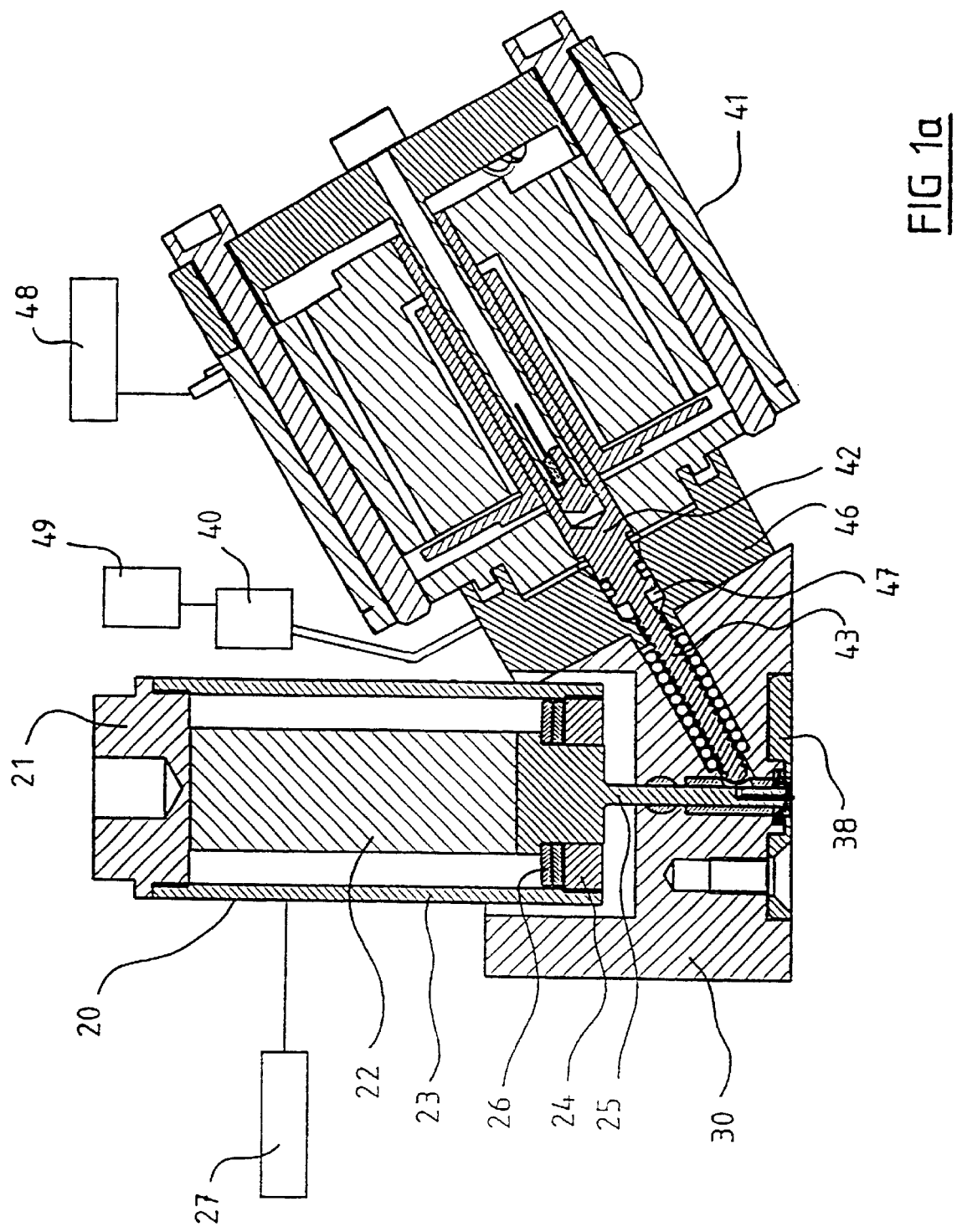
FIG. 1a shows a sectional view of a first embodiment of a device according to the invention.

A first embodiment of a solder paste jetting device according to the invention will now be described with reference to FIG. 1a, 1b, and 1c. The solder paste jetting device comprises a piezoelectric actuator 20 including: an actuator support 21; a set of piezoelectric discs forming a piezoelectric stack 22 which is rigidly connected to the actuator support 21; an actuator housing 23 also being rigidly connected to the actuator support 21 and encompassing the piezoelectric stack 22; an actuator check nut 24 which is rigidly connected to the end of the actuator housing 23 opposite the actuator support 21; a plunger 25 which is rigidly connected to the end of the piezoelectric stack 22 opposite the actuator support 21 and which is axially movable while slidably extending through a bore in the actuator check nut 24; and cup springs 26 provided to resiliently balance the plunger 25 against the actuator check nut 24 to provide a preload for the actuator. A schematically shown eject control unit 27 is provided to intermittently apply a drive voltage to the piezoelectric stack 22, thereby causing an intermittent extension thereof and hence a reciprocating movement of the plunger with respect to the actuator housing 23 and check nut 24, in accordance with solder pattern printing data.

The piezoelectric actuator 20 is rigidly connected to a solder eject housing 30 having a through bore 31 extending through the solder eject housing 30 and being provided with a temperature controlled sleeve 32, a bushing 33, a sealing 34, and a nozzle plate 35 being secured by a nozzle support washer 38 and having an eject nozzle 36 to be operatively directed against an electronic circuit board (not shown) onto which small droplets of solder paste is to be jetted. The plunger 25 comprises a piston portion which is slidably and axially movably extending through the bore 31, an end surface of said piston portion of the plunger 25 being arranged close to said nozzle plate 35. An eject chamber 37 is defined by the shape of the end surface of the plunger 25, the sealing 34, and the nozzle plate 35. Axial movement of the plunger 25 towards the nozzle plate 35, said movement being caused by the intermittent extension of the piezoelectric stack 22, will cause a rapid decrease in the volume of the chamber 37 and thus a rapid pressurisation and jetting through the eject nozzle 36, of any solder paste contained in the chamber 37.

Solder paste is supplied to the chamber 37 from a schematically shown supply container 40 via a feeding device, said feeding device comprising an electric motor 41, which is rigidly connected to the solder eject housing 30 via a motor support 46, said motor 41 having a motor shaft 42 partly provided in a tubular bore 44 having an inlet 54 and an outlet 53 and extending through the motor support 46 and the solder eject housing 30 and communicating at the outlet 53 with the through bore 31. An end portion of the motor shaft 42 forms a rotatable feed screw 43 which is provided in, and is coaxial with, the portion of the tubular bore 44 defined in the solder eject housing 30. An essential portion of the rotatable feed screw 43 is surrounded by an array of resilient, elastomeric o-rings 45 arranged coaxially therewith in the tubular bore 44, the threads of the rotatable feed screw 43 making sliding contact with the innermost surface of the o-rings 45.

A schematically shown pressurisation pump 49 is arranged to apply a pressure on the solder paste contained in the supply container 40, thereby feeding said solder paste from the container 40 through a schematically shown conduit to an inlet port 47 communicating with the tubular bore 44 and arranged in the motor support 46 between the rotatable feed screw 43 and the electric motor 41. A schematically shown supply control unit 48 provides an electronic control signal to the electronic motor 41, thereby causing the motor shaft 42, and thus the rotatable feed screw 43, to rotate a desired angle, or at a desired rotational speed. Solder paste captured between the threads of the rotatable feed screw 43 and the inner surface of the o-rings 45 then travels from the inlet port 47 to the through bore 31 via the inlet 54 in accordance with the rotational movement of the motor shaft 42. The pressure provided by the pressurisation pump 49 is large enough to ensure an essentially void free condition within said tubular bore and is small enough not to force said medium through said tubular bore in excess of the feed action provided by said rotatable feed screw 43. The solder paste is then fed from the outlet 53 of the tubular bore 44 to the chamber 37 via a channel 39 provided in the piston portion of the plunger 25, said channel having a first portion extending perpendicular to said plunger and communicating with the tubular bore 44 and a second portion extending coaxially with and within the plunger 25 from said first portion to the end surface of the plunger 25 facing the eject chamber 37.

Hence, in operation, the solder paste is applied from the supply container 40 to the eject chamber 37 through the tubular bore 44 and the channel 39 by the action of the rotatable feed screw 43. The solder paste is then jetted from the eject chamber 37 through the eject nozzle 36 towards an electronic circuit board (not shown) by the rapid actuation of the plunger 25.

Figure 1B:
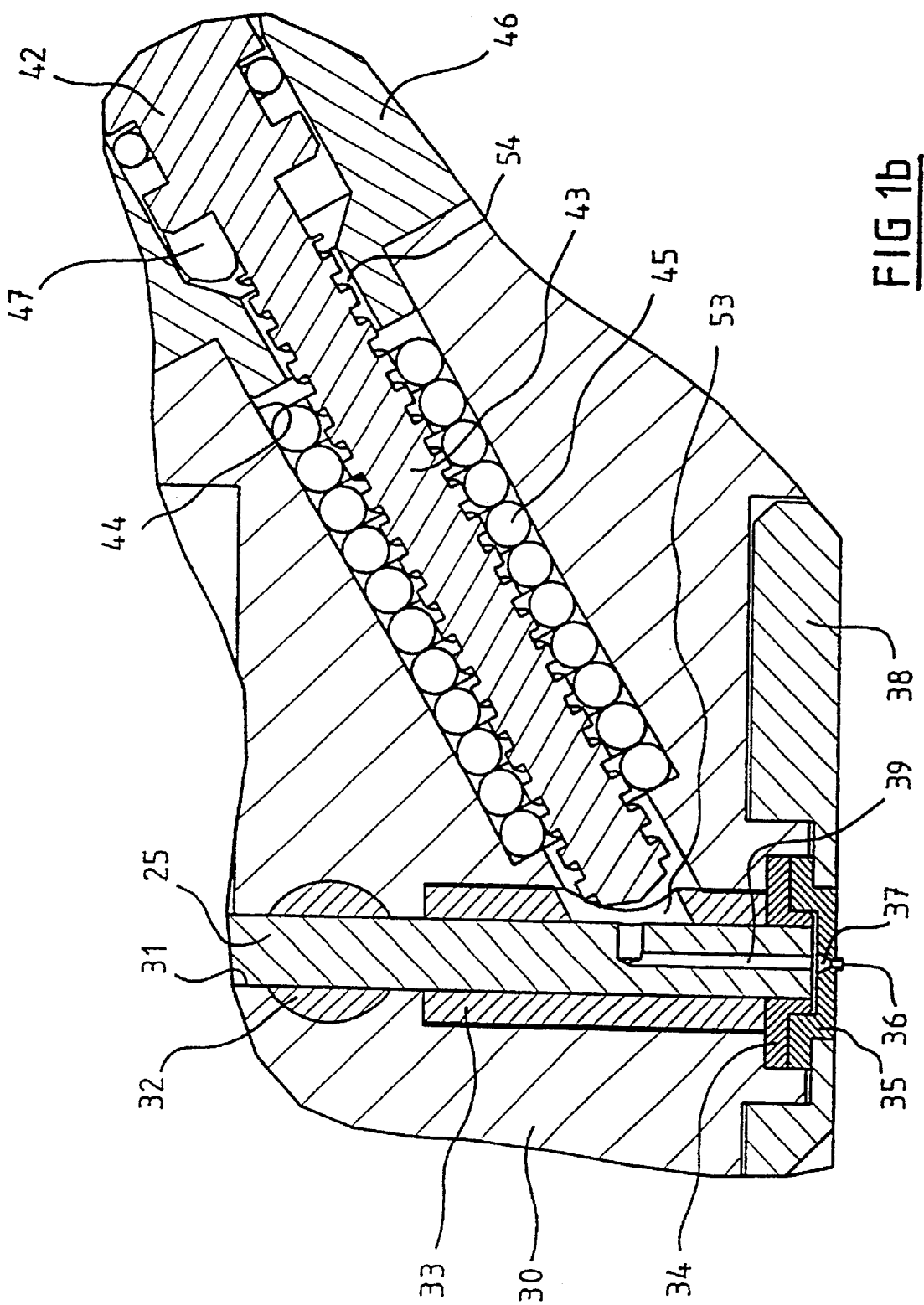

In the alternative embodiment shown in FIG. 1c, instead of using an array of o-rings 45 as in the embodiment shown in FIG. 1b, an elastomeric sleeve 45a is provided to surround the rotatable feed screw 43.

A second embodiment of a solder paste jetting device according to the invention will now be described with reference to FIGS. 2a, 2b, and 2c. The solder paste jetting device in FIGS. 2a and 2b comprises a piezoelectric actuator 120 including: an actuator support 121 having a base portion 121a and a cylinder portion 121b, said cylinder portion 121b extending essentially perpendicular to said base portion; a plunger 125 which is rigidly connected to the end surface of the cylindrical portion 121b opposite the base portion 121a of the actuator support 121; a set of piezoelectric discs forming a hollow piezoelectric stack 122 which is rigidly connected to the base portion 121a of the actuator support 121 and which is coaxial with and encompasses the cylinder portion 121b thereof; an actuator housing 123, also being rigidly connected to the actuator support 121 and encompassing the piezoelectric stack 122; an actuator check nut 124 which is rigidly connected to the actuator housing 123; a nozzle support assembly 129 which is rigidly connected to the piezoelectric stack 122 and which is slidably extending through a bore in the actuator check nut 124; cup springs 126 provided to resiliently balance the nozzle support assembly 129 against the actuator check nut 124 to provide a preload for the actuator; an o-ring sealing 134; and a nozzle plate 135 having an eject nozzle 136 to be operatively directed against an electronic circuit board (not shown) onto which small droplets of solder paste is to be jetted. A schematically shown eject control unit 127 is provided to intermittently discharge the piezoelectric stack 122, hereby causing an intermittent contraction thereof and hence a reciprocating movement of the nozzle support assembly 129 and the nozzle plate 135 with respect to the actuator support 121, housing 123, check nut 124, and plunger 125, in accordance with solder pattern printing data.

An eject chamber 137 is defined by the shape of the end surface of the plunger 125 and the nozzle plate 135. Axial movement of the nozzle plate 135 towards the plunger 125, said movement being caused by the intermittent contraction of the piezoelectric stack 122, will cause a rapid decrease in the volume of said chamber 137 and thus a rapid pressurisation and jetting, through the eject nozzle 136, of solder paste contained in the chamber 137.

Figure 2A:
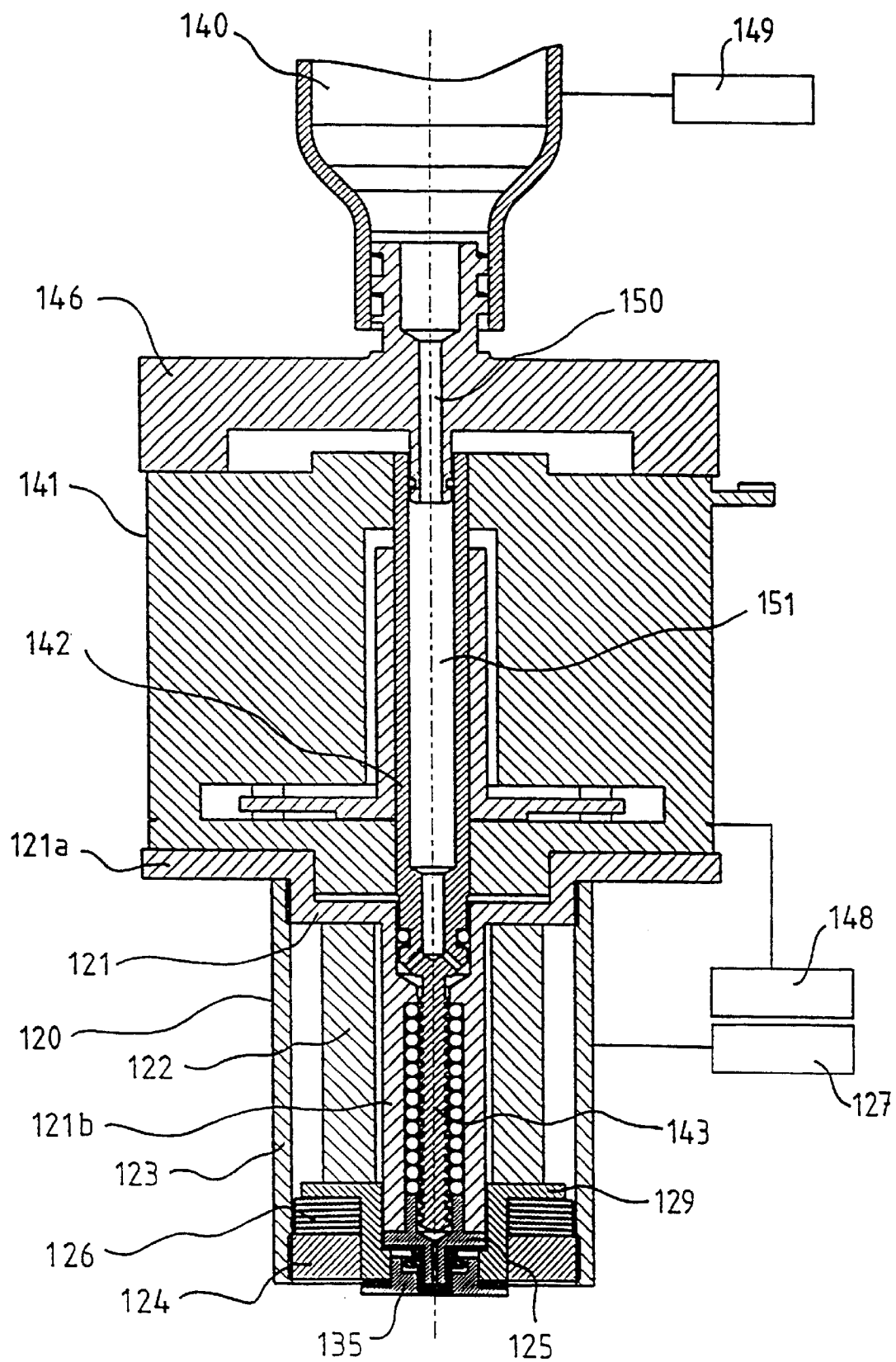
FIG. 2a shows a sectional view of a second embodiment of a device according to the invention.
Figure 2B:
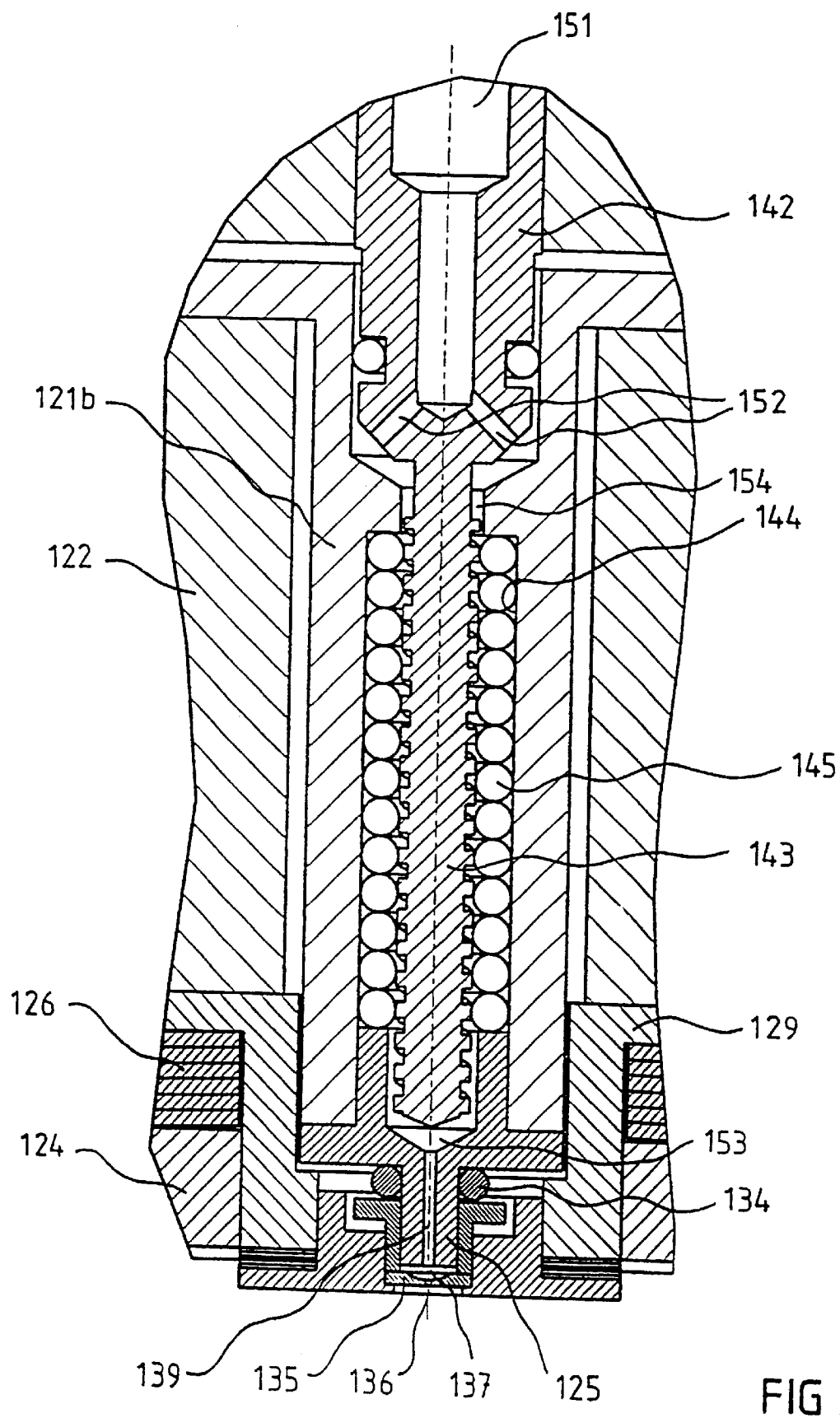

The solder paste jetting device in FIGS. 2a and 2b further comprises an electric motor 141 which is rigidly connected to the base portion 121a of the actuator support 121, said motor 141 having a partly hollow motor shaft 142, a portion of said shaft extending through a tubular bore 144 formed by the inner wall surface of the cylinder portion 121b of the actuator support 121 and having an inlet 154 and an outlet 153. An end portion of the motor shaft 142, forms a rotatable feed screw 143 which is provided in, and is coaxial with, the portion of the tubular bore 144 formed by the cylinder portion 121b of the actuator support 121. The rotatable feed screw 143 is surrounded by an array of resilient, elastomeric o-rings 145 arranged coaxially therewith in the tubular bore 144, the threads of the rotatable feed screw 143 making sliding contact with the innermost surface of the o-rings 145.

Solder paste is supplied to the eject chamber 137 from a supply container 140 through a feed tube 150 to the hollow interior 151 of the motor shaft 142 and then through feed ports 152 provided in the shaft 142 and extending from the hollow interior 151 to the exterior thereof at a location close to the feed input end of the rotational feed screw 143, i.e. close to the inlet 154. Rotation of the rotational feed screw 143 then transports the solder paste to the output end thereof, where the solder paste is forced through a channel 139 through the plunger 125 to the chamber 137.

A schematically shown pressurisation pump 149 is arranged to apply a pressure on the solder paste contained in the supply container 140, thereby forcing said solder paste to travel from the container 140 to the rotatable feed screw 143. A schematically shown supply control unit 148 provides an electronic control signal to the electronic motor 141, thereby causing the motor shaft 142, and thus the rotatable feed screw 143, to rotate a desired angle, or at a desired rotational speed. Solder paste captured between the threads of the rotatable feed screw 143 and the inner surface of the o-rings 145 thereby travels from the feed ports 152 at the input end of the rotatable feed screw 143 to the chamber 137 in accordance with the rotational movement of the motor shaft 142.

Hence, in operation, solder paste is applied from the supply container 140 to the eject chamber 137 through the motor shaft 142 and the tubular bore 144 formed by the cylinder portion 121b of the actuator support 121 by the action of the rotatable feed screw 143. The solder paste is then jetted from the eject chamber 137 through the eject nozzle 136 towards an electronic circuit board (not shown) by the rapid actuation of the piezoelectric stack 122 and hence the nozzle support assembly 129.

Figure 2C:
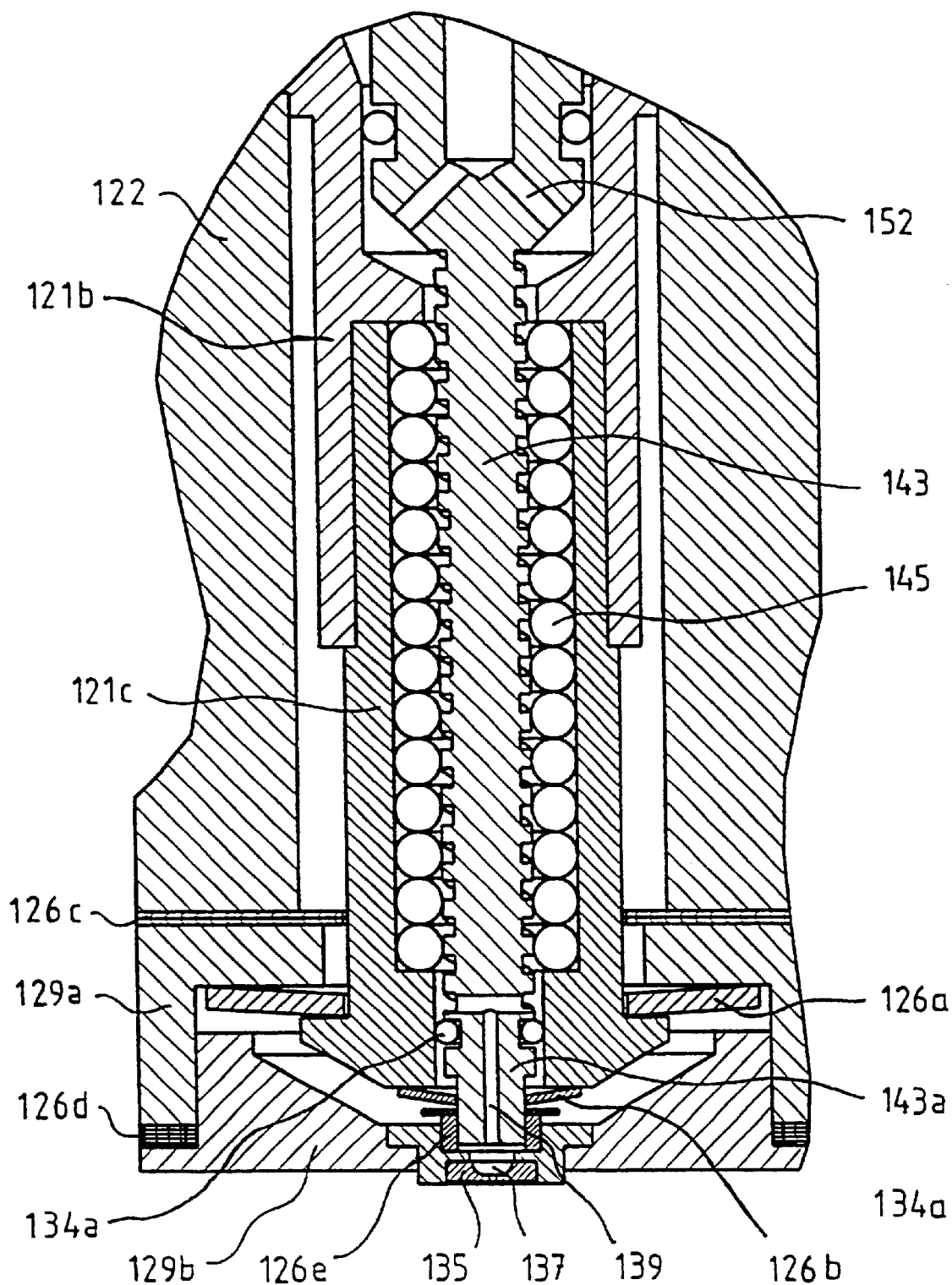

With reference to FIG. 2c, illustrating an alternative embodiment of the central portion of the embodiment shown in FIG. 2a, instead of using a separate plunger element, such as the plunger 125 in FIG. 2a, the plunger element is formed by an end portion 143a of the rotatable feed screw 143, i.e. the rotatable feed screw and the plunger is provided in the form of one single structural element.

In FIG. 2c, the array of o-rings 145 (or for example an elastomeric sleeve of the kind shown in FIG. 1c) surrounding the feed screw 143 is kept in place by an o-ring support 121c which is fixed to and forms a continuation of the cylinder portion 121b of the actuator support 121. The o-ring support 121c also provides a preload for the actuator via a cup spring 126a and an end plate 129a.

The nozzle plate 135 is supported by the nozzle support 129b which is attached to the end plate 129a. Shims 126c, 126d are provided to compensate for differences in actuator lengths, to adjust the preload, and to adjust the distance from the end of the feed screw 143 to the nozzle plate 135.

The nozzle is pressed against the nozzle support 129b by another cup spring 126b via a bushing 126e surrounding the protruding part of the feed screw 143. This bushing 126e is also provided to prevent leakage from the eject chamber 137. An o-ring seal 134a is also provided to prevent leakage.

Solder paste is thus delivered through the feed ports 152 and is transported by the rotational movement of the rotatable feed screw 143. At the output end of the treads of the feed screw 143, there is a radial hole in the screw leading to an axial channel 139 within a protruding portion of the screw. Through this channel the solder paste is delivered to the eject chamber 137.

Since these and other details of the embodiment shown in FIG. 2c have already been described with reference to similar details in FIGS. 2a and 2b, further description of the design and operation of the embodiment of FIG. 2c is omitted, and is readily understood by those skilled in the art.

Even though the invention has been described above using exemplifying embodiments thereof, alterations, modifications and combinations thereof, as understood by those skilled in the art, may be made within the scope of the invention, which is defined by the accompanying claims. For example, even though it is the plunger that forms the movable eject element in FIGS. 1a–1c, whereas the nozzle assembly forms the movable eject element in FIGS. 2a–2c, embodiments of the opposite, although not shown, are readily realised and comprised within the scope of the invention.

What is claimed is:

1. A device for jetting droplets of a viscous medium onto a substrate, preferably an electronic circuit board, said device comprising:
    an eject chamber for containing a small volume of said medium prior to the jetting thereof, an eject nozzle communicating with the eject chamber, eject means for jetting said medium from the eject chamber through said nozzle; and
    supply means for feeding said medium into the eject chamber, said supply means comprising:
    means defining a tubular passage,
    an inlet for introducing said medium into said tubular passage and an outlet for passing said medium from said tubular passage towards said chamber,
    a rotatable feed screw provided in said tubular passage for, upon rotation thereof, forcing said medium through said tubular passage in the direction towards said chamber, and
    drive means for rotating said rotatable feed screw.

2. A device as claimed in claim 1, wherein at least an inner portion of said means defining a tubular passage show elastic properties.

3. A device as claimed in claim 1, wherein said means defining a tubular passage comprise an elastomeric tubular-sleeve surrounding at least a portion of said rotatable feed screw.

4. A device as claimed in claim 1, wherein said means defining a tubular passage comprise an array of elastomeric o-rings surrounding at least a portion of said rotatable feed screw.

5. A device as claimed in claim 1, wherein the threads of said rotatable feed screw are in sliding contact with the inner walls of said means defining a tubular passage.

6. A device as claimed in claim 1, comprising a viscous medium supply container communicating with said inlet for providing a source for said medium.

7. A device as claimed in claim 6, comprising means for providing a pressure upon the medium contained in said viscous medium supply container to force said medium from said viscous medium supply container into said tubular passage, said pressure being sufficiently large to ensure an essentially void free condition within said tubular passage and being sufficiently small not to force said medium through said tubular passage in excess of the feed action provided by said rotatable feed screw.

8. A device as claimed in claim 1, comprising a plunger defining a wall of said eject chamber, wherein a channel is provided within said plunger, said medium being fed from said tubular passage to said eject chamber via said channel.

9. A device as claimed in claim 8, wherein at least a portion of said channel at the end of the plunger facing said eject chamber is coaxially arranged with respect to said plunger.

10. A device as claimed in claim 8, wherein an end portion of said rotatable feed screw forms said plunger.

11. A device as claimed in claim 8, wherein said eject means comprise said plunger.

12. A device as claimed in claim 8, wherein said eject means comprise said nozzle, said nozzle being arranged for reciprocating movement.

13. A device as claimed in claim 1, wherein said tubular passage and said rotatable feed screw are arranged coaxially with respect to the direction of eject movement of said eject means.

14. A device as claimed in claim 1, wherein said tubular passage and said rotatable feed screw are arranged to supply said medium at an angle with respect to the direction of movement of said eject means.

15. A device as claimed in claim 1, wherein said rotatable feed screw is multi-threaded, preferably double-threaded.

16. A device as claimed in claim 1, wherein said viscous medium is a solder paste.

17. A device as claimed in claim 1, wherein said viscous medium is an adhesive.

18. A device as claimed in claim 17, wherein said viscous medium is an adhesive from the group consisting of surface mounting glue and electrically conducting glue.

19. Supply means for feeding a viscous medium to a dispensing location in a viscous medium dispensing device, said supply means comprising:
    means defining a tubular passage, wherein at least an inner portion of said means defining a tubular passage show elastic properties,
    an inlet for introducing said medium into said tubular passage and an outlet for passing said medium from said tubular passage towards said dispensing location,
    a rotatable feed screw provided in said tubular passage for, upon rotation thereof, forcing said medium through said tubular passage in the direction towards said dispensing location, and
    drive means for rotating said rotatable feed screw.

20. The supply means as claimed in claim 19, wherein said means defining a tubular-passage comprise an elastomeric tubular sleeve surrounding at least a portion of said rotatable feed screw.

21. The supply means as claimed in claim 19, wherein said means defining a tubular passage comprise an array of elastomeric o-rings surrounding at least a portion of said rotatable feed screw.

22. The supply means as claimed in claim 19, wherein the threads of said rotatable feed screw are in sliding contact with the inner walls of said means defining a tubular passage.

23. The supply means as claimed in claim 19, wherein the dispensing device is a device for jetting said viscous medium.

24. A method for jetting droplets of a viscous medium onto a substrate, preferably an electronic circuit board, said method comprising the steps of:
    supplying said medium from a viscous medium supply container to an eject chamber using a rotatable feed screw; and
    jetting said medium from the eject chamber in the form of droplets.

25. A method as claimed in claim 24, wherein said medium is supplied through a tubular passage and wherein the feed screw is arranged within said tubular passage, comprising the step of
    providing a pressure on the medium supplied from said supply container, said pressure being sufficiently large to ensure an essentially void free condition within said tubular passage and being sufficiently small not to force said medium through said tubular passage in excess of the feed action provided by said rotatable feed screw.

26. A method as claimed in claim 25, comprising the step of feeding said medium from said tubular passage to said eject chamber through a channel provided within a plunger defining a wall of said eject chamber.

* * * * *